United States Patent
Yang

(10) Patent No.: US 6,690,200 B2
(45) Date of Patent: Feb. 10, 2004

(54) DRIVING CIRCUIT FOR TRANSMISSION LINES

(75) Inventor: Chin-Hsin Yang, Taipei Hsien (TW)

(73) Assignee: PixArt Imagning Inc., Hsin-Chu (TW)

( * ) Notice: Subject to any disclaimer, the term of this patent is extended or adjusted under 35 U.S.C. 154(b) by 23 days.

(21) Appl. No.: 10/165,290

(22) Filed: Jun. 6, 2002

(65) Prior Publication Data

US 2003/0132781 A1 Jul. 17, 2003

(30) Foreign Application Priority Data

Jan. 16, 2002 (TW) ........................... 91100577 A

(51) Int. Cl.[7] ............................................. H03K 19/175
(52) U.S. Cl. ............................. 326/90; 326/82; 327/108
(58) Field of Search ............................. 326/82, 89, 90; 327/108, 109, 110, 297; 710/305

(56) References Cited

U.S. PATENT DOCUMENTS

| 4,504,779 A | * | 3/1985 | Haman | 323/349 |
|---|---|---|---|---|
| 4,544,934 A | * | 10/1985 | Owada et al. | 347/144 |
| 5,034,632 A | * | 7/1991 | Jansson et al. | 326/19 |
| 5,668,716 A | * | 9/1997 | Otomo | 700/2 |
| 6,377,072 B2 | * | 4/2002 | Oshio | 326/80 |

FOREIGN PATENT DOCUMENTS

| JP | 56034227 A | * | 4/1981 | ......... H03K/17/04 |

* cited by examiner

Primary Examiner—James H. Cho
(74) Attorney, Agent, or Firm—Fish & Richardson P.C.

(57) ABSTRACT

A driving circuit for transmission lines. The driving circuit transforms outgoing signals of an internal circuit to signals large enough to be sent to an external circuit by the transmission lines, especially for RS-232 transmission lines. It comprises three transistors, six resistors, three capacitors and one diode. The expensive signal driver chip needed in the conventional circuit is not necessary in the present invention. The expensive chip is replaced by cheap discrete components. This reduces the cost of the driving circuit.

5 Claims, 2 Drawing Sheets

DRIVING CIRCUIT FOR TRANSMISSION LINES

Pursuant to 35 U.S.C. §119(a)–(d), this application claims priority from Taiwanese application no. 91100577, filed on Jan. 16, 2002.

BACKGROUND OF THE INVENTION

1. Field of the Invention

The present invention relates to a driving circuit for transmission lines, particularly to a driving circuit for transmission lines which is composed of discrete components so that the cost of the driving circuit is reduced.

2. Description of the Prior Art

FIG. 1 is a diagram showing a conventional driving circuit for an RS-232 transmission line. An internal circuit 11 sends an outgoing signal Tx to a signal driver chip 12. The chip 12 transforms the outgoing signal Tx to a signal Txd large enough to be sent to an external circuit 13 by the RS-232 transmission line 14. The external circuit 13 sends an incoming signal Rxd through the RS-232 transmission line 14 to the chip 12. The chip 12 transforms the incoming signal Rxd to a signal Rx sent to the internal circuit 11.

However, the signal driver chip 12 is very expensive so that the conventional driving circuit of RS-232 transmission line suffers a high cost.

SUMMARY OF THE INVENTION

Therefore, the object of the present invention is to provide a driving circuit for transmission lines which is composed of cheap discrete components. This effectively reduces the cost of the driving circuit.

The present invention provides a driving circuit for transmission lines, receiving a first outgoing signal from an internal circuit and an incoming signal from an external circuit, and sending a second outgoing signal to the external circuit. The driving circuit comprises a first transistor having an emitter connected to receive a first voltage, a collector and a base, a second transistor having a collector connected to the collector of the first transistor, an emitter and a base, a third transistor having a collector connected to receive a second voltage, an emitter through which the second outgoing signal is sent and a base, a first, second, third, fourth, fifth and sixth impedance connected between a node through which the first outgoing signal is received and the base of the first transistor, the emitter and the base of the first transistor, the collector and the base of the third transistor, the base of the third transistor and the emitter of the second transistor, the emitters of the second and third transistor, and the base of the second transistor and the collector of the third transistor, a first, second and third capacitor connected between the node and the base of the second transistor, the collector of the first transistor and the emitter of the third transistor, and the emitter of the second transistor and the collector of the third transistor, and a diode having an anode connected to the emitter of the second transistor and a cathode connected to receive the incoming signal.

Thus, the expensive signal driver chip in the conventional driving circuit is replaced by cheap discrete components in the invention, which reduces the cost.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
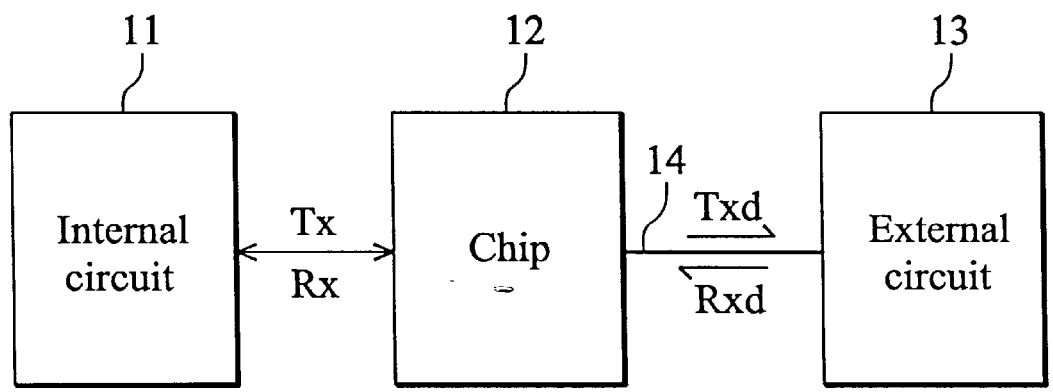
FIG. 1 is a diagram showing a conventional driving circuit of an RS-232 transmission line.
Figure 2:
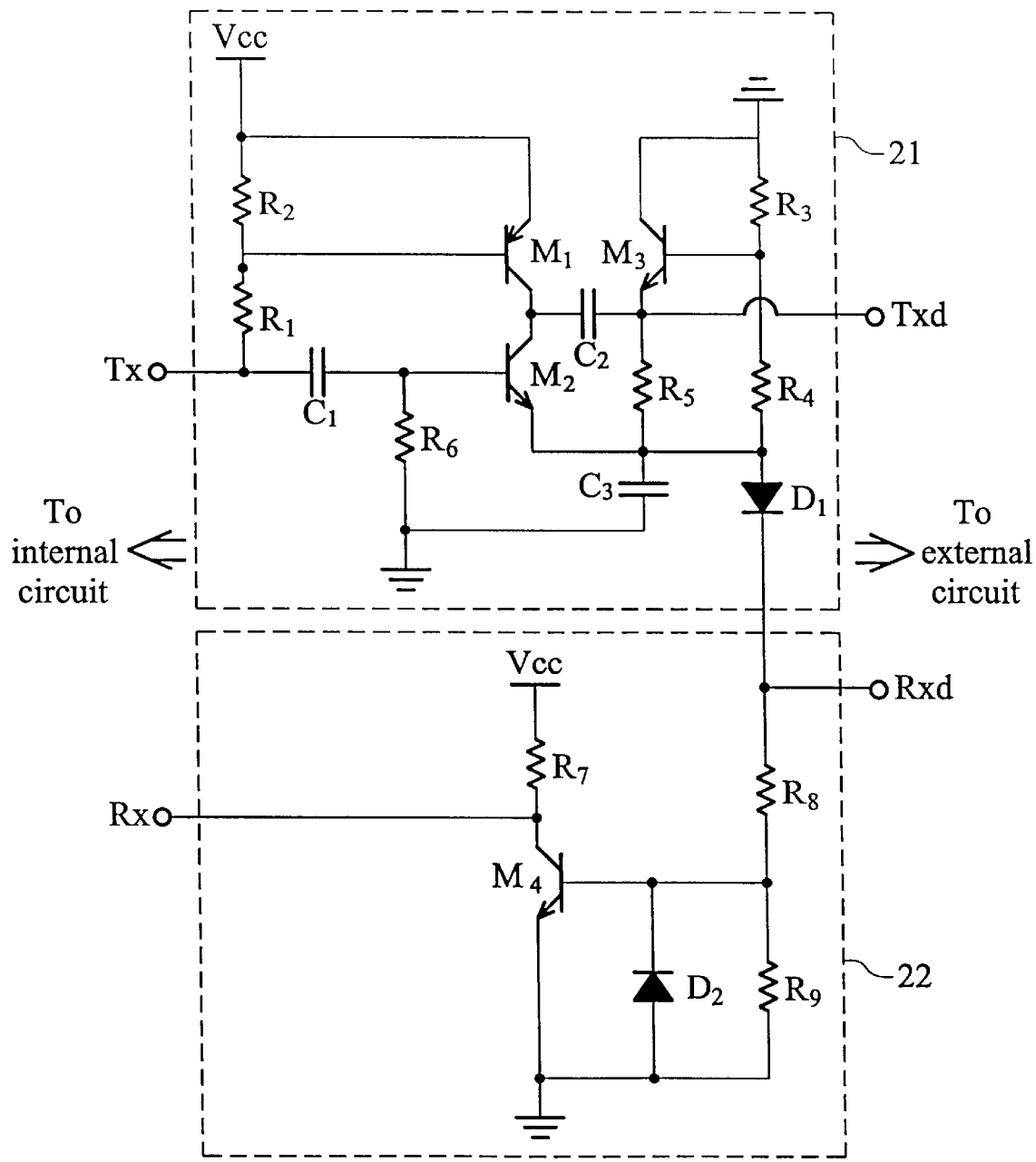
FIG. 2 is a diagram showing a driving circuit of an RS-232 transmission line according to one embodiment of the invention.

FIG. 2 is a diagram showing a driving circuit of an RS-232 transmission line according to one embodiment of the invention. The driving circuit 2 includes an outgoing circuit 21 receiving an outgoing signal Tx from an internal circuit (not shown) and sending an outgoing signal Txd to an external circuit (not shown), and an incoming circuit 22 receiving an incoming signal Rxd from the external circuit and sending an incoming signal Rx to the internal circuit.

The outgoing circuit 21 comprises transistors M1, M2 and M3, capacitors C1, C2 and C3, resistors R1, R2, R3, R4, R5 and R6, and diode D1. The transistor M1 is a P type transistor, and the transistors M2 and M3 are N type transistors. The transistor M1 has an emitter connected to receive a voltage Vcc(3V). The transistor M2 has a collector connected to the collector of the transistor M1. The transistor M3 has a collector connected to a ground (0V), an emitter through which the outgoing signal Txd is sent. The resistors R1, R2, R3, R4, R5 and R6 are connected between an input node through which the outgoing signal Tx is received and the base of the transistor M1, the emitter and the base of the transistor M1, the collector and the base of the transistor M3, the base of the transistor M3 and the emitter of the transistor M2, the emitters of the transistors M1 and M3, and the base of the transistor M2 and the collector of the transistor M3 (the ground). The capacitor C1, C2 and C3 are connected between the input node and the base of the transistor M2, the collector of the transistor M1 and the emitter of the transistor M3, and the emitter of the transistor M2 and the collector of the transistor M3 (the ground). The diode D1 has an anode connected to the emitter of the transistor M2 and a cathode connected to receive the incoming signal Rxd.

The incoming circuit 22 comprises a transistor M4, resistors R7, R8 and R9, and a diode D2. The transistor M4 has an emitter connected to the ground and a collector through which an incoming signal Rx is sent to the internal circuit. The resistors R7, R8 and R9 are connected between the emitter of the transistor M1 (Vcc) and the collector of the transistor M4, the cathode of the diode D1 and the base of the transistor M4, and the base of the transistor M4 and the collector of the transistor M3. The diode D2 has an anode connected to the ground and a cathode connected to the base of the transistor M4.

The operation of the driving circuit 2 will be explained in the following.

At the beginning, the incoming signal Rxd has a voltage level of −12V when the incoming signal Rxd is not asserted. This turns the diodes D1 and D2 on, and further turns the transistor M2 on and the transistor M4 off. Thus, the incoming circuit 22 is not active. There is a voltage of 5V on the base of the transistor M3 by selecting a proper ratio of resistors R3 to R4. The voltage on the base and emitter of the transistor M3 is approximately the same since the transistor M3 acts as a follower. Therefore, there is also a voltage of 5V on the emitter of the transistor M3. Additionally, there is a voltage of 10V on the transistor M2 which has been turned on. This results in a voltage difference of 5V across the capacitor C2. The outgoing signal Txd has a voltage level of −5V.

Next, the voltage level of the outgoing signal Tx is suddenly switched from a high level to a low level when the internal circuit starts to send out the outgoing signal Tx. This results in a sudden voltage drop where the base of the transistor M2 connects with the capacitor C1, and where the resistor R1 connects with R2. Thus, the transistor M2 is turned off and the transistor M1 is turned on. There is a voltage of approximately Vcc (5V) on the collector of the transistor M2, whereby the voltage on the emitter of the transistor M3 increases to 5V. Therefore, the voltage level of the outgoing signal Txd may swing in a range between 5V and −5V, which is large enough for signal transmission on the RS-232 transmission line 14.

When the external circuit starts to send the incoming signal Rxd to the internal circuit, the signal Rxd is asserted by being switched from −12V to 12V. This turns off the diode D1 and D2, and inactivates the outgoing circuit 21. The transistor M4 acts as an inverter and generates on the collector the inverted signal Rxd of the incoming signal Rx. The signal Rxd has an amplitude smaller than the signal Rx.

In this embodiment, the driving circuit 2 is composed of discrete transistors, capacitors and resistors. There is no serious impact on the RS-232 signal transmission even if the operating voltage (Vcc) is somehow decreased to 2V.

In conclusion, the present invention provides a driving circuit for transmission lines which are composed of cheap discrete components replacing the expensive signal driver chip in the conventional driving circuit. This effectively reduces the cost of the driving circuit.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A driving circuit for transmission lines, receiving a first outgoing signal from an internal circuit and an incoming signal from an external circuit, and sending a second outgoing signal to the external circuit, the driving circuit comprising:
   a first transistor having an emitter connected to receive a first voltage, a collector and a base;
   a second transistor having a collector connected to the collector of the first transistor, an emitter and a base;
   a third transistor having a collector connected to receive a second voltage, an emitter through which the second outgoing signal is sent and a base;
   a first, second, third, fourth, fifth and sixth impedance connected between a node through which the first outgoing signal is received and the base of the first transistor, the emitter and the base of the first transistor, the collector and the base of the third transistor, the base of the third transistor and the emitter of the second transistor, the emitters of the second and third transistor, and the base of the second transistor and the collector of the third transistor, respectively;
   a first, second and third capacitor connected between the node and the base of the second transistor, the collector of the first transistor and the emitter of the third transistor, and the emitter of the second transistor and the collector of the third transistor; and
   a diode having an anode connected to the emitter of the second transistor and a cathode connected to receive the incoming signal.

2. The driving signal as claimed in claimed 1 further comprising:
   a fourth transistor having an emitter connected to receive the second voltage and a collector through which a second incoming signal is sent to the internal circuit and a base;
   a seventh, eighth and ninth impedance connected between the emitter of the first transistor and the collector of the fourth transistor, the cathode of the diode and the base of the fourth transistor, and the base of the fourth transistor and the collector of the third transistor; and
   a second diode having an anode connected to receive the second voltage and a cathode connected to the base of the fourth transistor.

3. The driving circuit as claimed in claim 1, wherein the first transistor is a P type transistor, and the second and third transistor are N type transistors.

4. The driving circuit as claimed in claim 1, wherein the first voltage is 3V and the second voltage is 0V.

5. The driving circuit as claimed in claim 1, wherein the fourth transistor is a N type transistor.

* * * * *